United States Patent [19]

Osborne et al.

[11] Patent Number: 6,140,591
[45] Date of Patent: Oct. 31, 2000

[54] PLUNGER STAND-OFF ASSEMBLY

[75] Inventors: Jon Richard Osborne, Wauseon; Conrad A. H. Jelinger, Toledo, both of Ohio

[73] Assignee: Unitrend, Inc., Toledo, Ohio

[21] Appl. No.: 09/148,007

[22] Filed: Sep. 4, 1998

[51] Int. Cl.⁷ ................................................. H01B 17/02
[52] U.S. Cl. ..................................... 174/138 E; 361/787
[58] Field of Search .............................. 174/135, 138 E, 174/138 G; 361/758, 754, 787, 804, 807, 808, 809, 810, 811, 812, 798

[56] References Cited

U.S. PATENT DOCUMENTS

| Re. 36,351 | 10/1999 | Yamamoto et al. | 260/728.2 |
|---|---|---|---|
| 4,695,923 | 9/1987 | Abraham | 361/807 X |
| 4,901,204 | 2/1990 | Hayashi | 361/807 |
| 5,223,574 | 6/1993 | Reznikov | 174/138 G X |
| 5,963,432 | 10/1999 | Crowley | 174/138 G X |

FOREIGN PATENT DOCUMENTS 1540-044  1/1990  U.S.S.R. ................................ 361/807

*Primary Examiner*—Dean A. Reichard
*Assistant Examiner*—Adolfo Nino
*Attorney, Agent, or Firm*—MacMillan, Sobanski & Todd, LLC

[57] ABSTRACT

A plunger stand-off assembly for securing a circuit board to a computer chassis without the need for tools. The plunger stand-off assembly includes an inner component, an outer component, and a spring for causing relative movement between the inner and outer components. The relative movement between the inner and outer components securely fastens the circuit board to the computer chassis.

17 Claims, 3 Drawing Sheets

PLUNGER STAND-OFF ASSEMBLY

BACKGROUND OF THE INVENTION

This invention relates in general to a stand-off, and in particular, to a plunger stand-off that fastens a circuit board in place without the use of tools.

A stand-off assembly is used to anchor a computer circuit board, such as a motherboard, to the computer chassis. Typically, the stand-off assembly is made of metal and requires a screw or other means for fastening the circuit board in place. However, this practice requires that the computer power to be turned off in order to avoid risk of electrical shock to the technician and/or damage to the computer. Therefore, it would be desirable to provide a stand-off assembly that fastens the circuit board in place without using tools and without the need to power down the computer.

SUMMARY OF THE INVENTION

It is an object of the invention to provide a stand-off assembly that fastens a circuit board to a computer chassis without the need to power down the computer.

It is another object of the invention to provide a stand-off assembly that include a plunger to fasten a circuit board to the computer chassis without the need for tools.

To achieve these and other objects, the stand-off assembly comprises an inner component, an outer component capable of relative movement with the inner component, and a spring for biasing the inner and outer components for causing relative movement therebetween. The relative movement between the inner and outer components securely fastens the circuit board to the chassis.

Various objects and advantages of this invention will become apparent to those skilled in the art from the following detailed description of the preferred embodiment, when read in light of the accompanying drawings.

DETAILED DESCRIPTION OF THE PREFERRED EMBODIMENT

Figure 1:
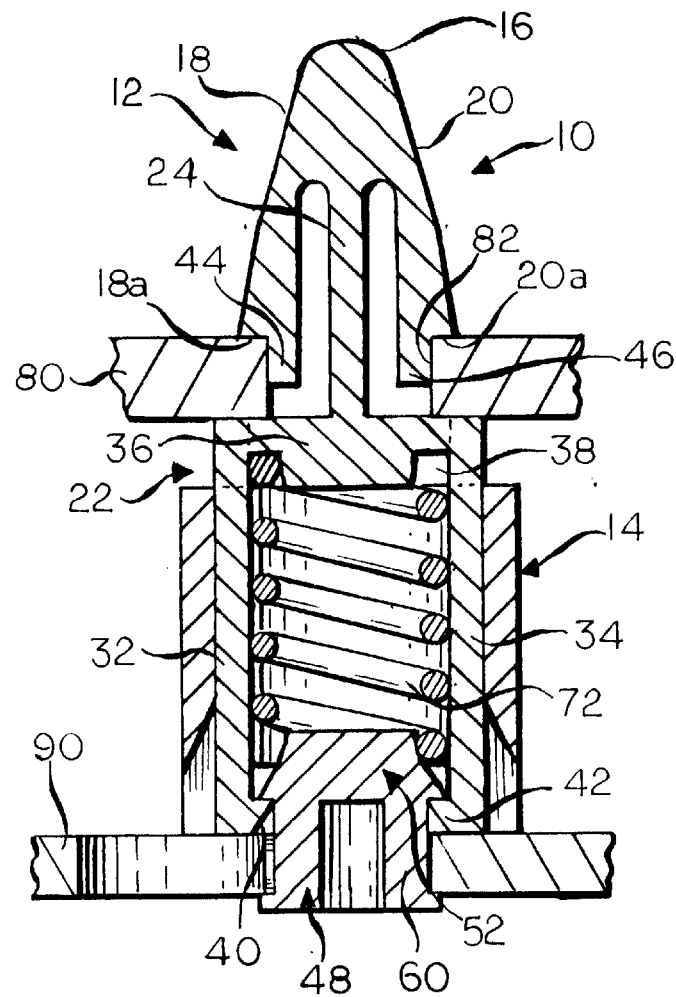
FIG. 1 is side cutaway view of the plunger stand-off according to a preferred embodiment of the invention when in an installed position.
Figure 2:
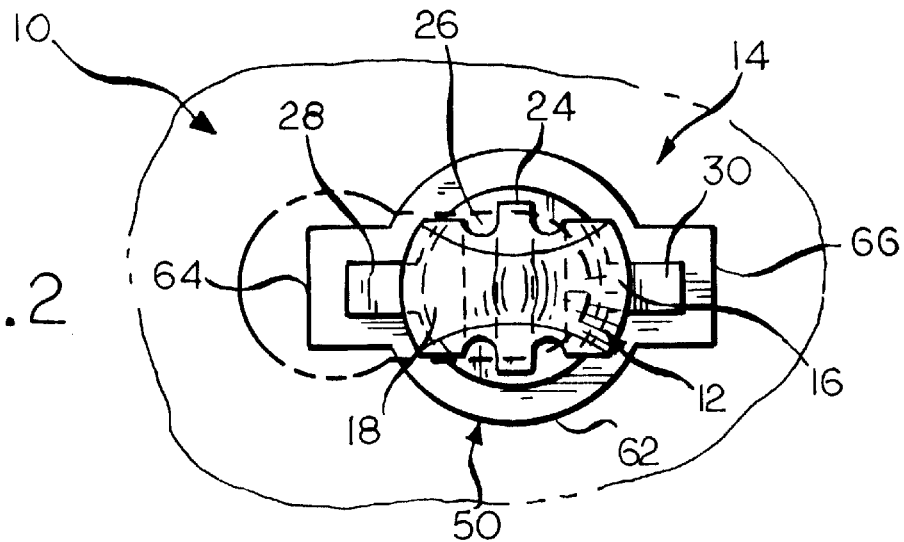
FIG. 2. is a top view of the plunger stand-off according to the preferred embodiment of the invention.

Referring now to the drawings, there is illustrated in FIGS. 1–4 a plunger stand-off assembly, shown generally at 10, according to a preferred embodiment of the invention.

The plunger stand-off assembly 10 includes an inner component, shown generally at 12, and an outer component, shown generally at 14. Both the inner and outer components 12, 14 are preferably made of 101L Nylon material, but it should be understood that the inner and outer components 12, 14 can be made of any suitable electrically non-conductive material, such as plastic, and the like.

The inner component includes a cone-shaped upper portion 16 having a pair of angled outer surfaces 18, 20 terminating at a lower surface forming steps 18a, 20a, respectively. The cone-shaped upper portion is integrally connected to a platform, shown generally at 22, by a central rib 24. Preferably, the platform 22 has a substantially circular-shaped central portion 26 and a pair of opposite, outwardly extending shoulders 28, 30. The inner component 12 also includes a pair of legs 32, 34 integrally connected with and extending downwardly from the outwardly extending shoulders 28, 30. The central portion 26 also includes a substantially circular step portion 36 having an outer diameter smaller than the outer diameter of the center portion 26 so as to form a substantially circular recess 38 between the circular step portion 36 of the central portion 26 and the downwardly extending legs 32, 34. The distal end of each leg 32, 34 includes an inwardly extending step 40, 42. The purpose of the steps 40, 42 and the recess 38 will be discussed in more detail below.

In the preferred embodiment, the cone-shaped upper portion 16 of the inner component 12 may also include a pair of downwardly extending ribs 44, 46 to allow the angled outer portions 18, 20 to flex inwardly toward the central rib 24 when external pressure is applied to the angled outer portions 18, 20. However, it should be noted that any suitable number of ribs may be used in order to allow the angled outer portions 18, 20 to adequately flex inwardly toward the central rib 24 when external pressure is applied to the angled outer portions 18, 20.

The outer component 14 includes an inner member, shown generally at 48, and an outer member, shown generally at 50. The inner member 48 includes an upper portion 52 having a substantially flat head 54 and a tapered outer surface 56. The tapered outer surface 56 terminates in a lower surface forming a step 58. The step 58 of the outer component 14 is preferably complimentary in shape to the steps 40, 42 at one end of the legs 32, 34 of the inner component 12 for mating contact therebetween. The inner member 48 also includes a substantially cylindrical lower portion 60 integrally connected with the outer member 50.

The outer member 50 includes a substantially circular middle section 62 forming a sleeve for the central portion 26 of the inner component 12. The outer member 50 also includes a pair of downwardly projecting end portions 64, 66 forming grooves or slots for receiving the legs 32, 34 of the inner component 12. An important feature of the end portions 64, 66 of the outer component 14 is to allow upward and downward movement of the legs 32, 34 of the inner component. That is, the inner component 12 is capable of relative movement with respect to the outer component 14. Each end portion 64, 66, is preferably angled at one end 68, 70 such that the lower end of each leg 32, 34 (the end that includes the steps 40 42) can flex outwardly when the inner member 48 of the outer component 14 is inserted into the inner component 12 during installation of the stand-off assembly 10.

The plunger stand-off assembly 10 further includes a helical compression spring 72. The spring 72 may be any suitable spring for providing a compressive force between the inner component 12 and the outer component 14. In the preferred embodiment, the spring 72 is made of 20 gauge spring wire and has a diameter of approximately 0.180 inches, a free length of approximately 0.400 inches, and a compressed length of approximately 0.235 inches. An important feature of the invention is that the spring 72 is totally enclosed or encapsulated by the non-conducting inner component 12 and the non-conducting outer component 14 when the plunger stand-off assembly 10 is assembled so that the computer (not shown) need not be powered down in order to install the plunger stand-off assembly 10 in the computer.

To assemble the plunger stand-off assembly 10, the spring 72 is disposed within the inner component 12 adjacent the platform 22 and the legs 32, 34. It should be noted that the spring 72 is received in the recess 38 formed by the step portion 36 of the inner component 12. Then, the inner component 12 and the spring 72 is vertically aligned with the inner member 48 of the outer component 14 such that the legs 32, 34 of the inner component 12 can be received in the end portions 64, 66 of the outer component 14. Next, the inner component 12 is moved relative to the outer component 14 until the tapered outer surface 56 of the upper portion 52 of the outer component 14 engages the steps 40, 42 of the inner component 12.

As the inner component 12 continues to move relative to the outer component 14, the tapered outer surface 56 of the outer component 14 causes the legs 32, 34 of the inner component 12 to flex outwardly. As this relative movement continues, the steps 40, 42 of the inner component 12 will no longer engage the tapered outer surface 56 of the outer component 14 and the steps 40, 42 will engage the cylindrical lower portion 60 of the outer component 14 due to the inherent resiliency of the plastic material of the inner component 12. At the same time, the spring 72 engages the tapered outer surface 56 of the outer component 14 and causes a downward bias on the tapered outer surface 56 of the outer component 14 and an upward bias on the platform 26 of the inner component 12. The downward and upward bias by the compression spring 72 causes the steps 40, 42 of the inner component 12 to be in mating contact with the step 58 of the outer component 14 and prevents any relative movement of the inner component 12 with respect to the outer component 14.

To install a circuit board 80 to a main chassis 90 of the computer using the plunger stand-off assembly 10 of the invention, the cone-shaped portion 16 of the inner component 12 is aligned with a mounting hole 82 in the circuit board 80. Once properly aligned with the mounting hole 82, the angled outer surfaces 18, 20 of the cone-shaped portion 16 engages the mounting hole 82 by causing relative movement between the circuit board 80 and the plunger stand-off assembly 10, for example, by applying a force to the plunger stand-off assembly 10 in the direction of the mounting hole 82.

As the angled outer surfaces 18, 20 of the cone-shaped portion 16 engage the mounting hole 82, the ribs 44, 46 allow the angle outer surfaces 18, 20 to flex or move inwardly toward the central rib 24 as the cone-shaped portion 16 continues to move relative to the mounting hole 82. As this relative movement continues, the angled outer surfaces 18, 20 of the cone-shaped portion 16 will no longer engage the mounting hole 82 and the steps 18a, 20a will engage a top surface 84 of the circuit board 80 due to the inherent resiliency of the plastic material of the inner component 12. Preferably, the distance between the steps 18a, 20a and the platform 22 is approximately equal to the thickness of an electrical component, for example, a circuit board or a computer motherboard 80. As a result, the central portion 26 and the shoulders 28, 30 also engage a lower surface 86 of the circuit board 80 to hold the inner component 12 of the plunger stand-off assembly 10 securely in place.

Figure 3:
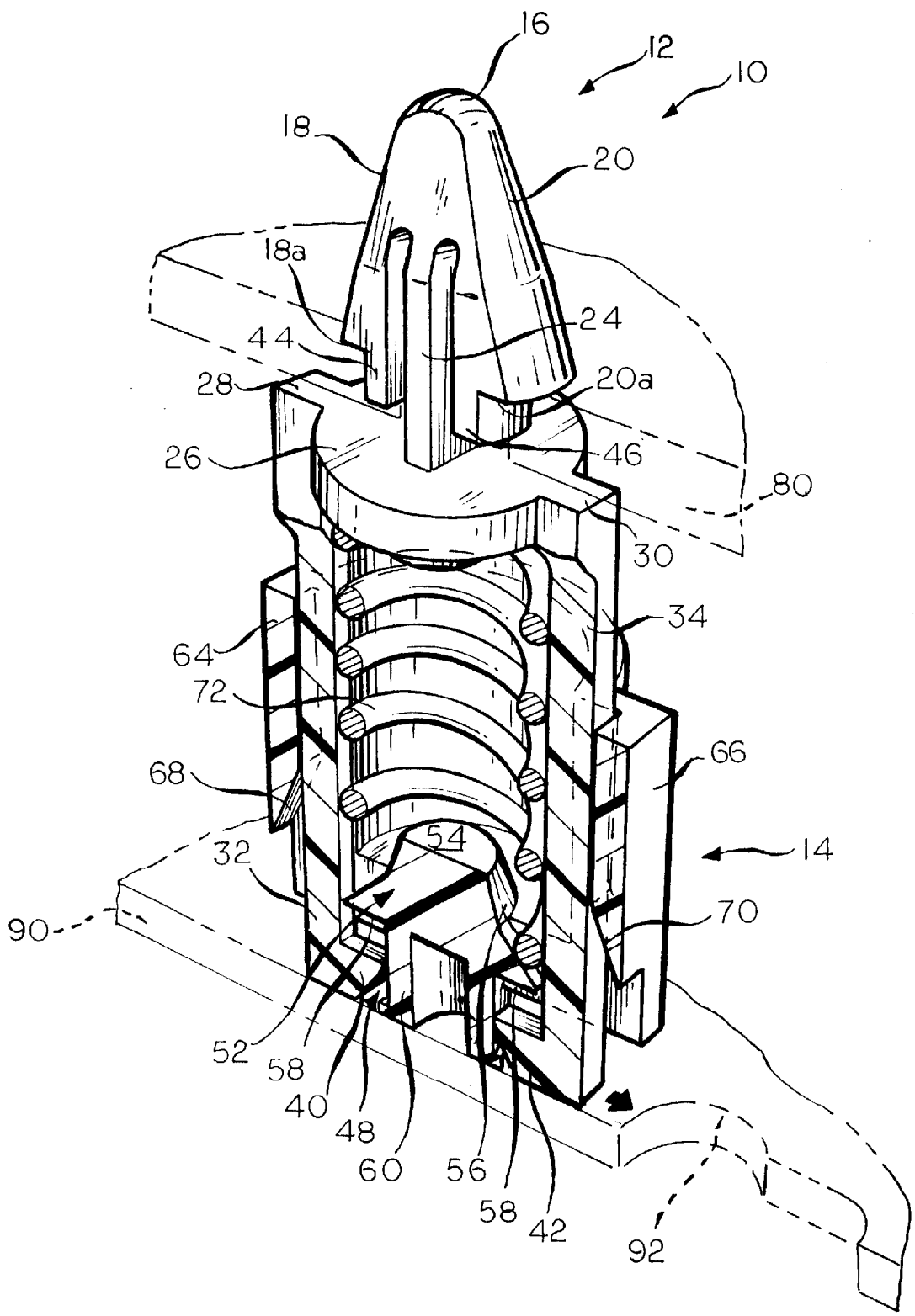
FIG. 3. is a partial cutaway perspective view of the plunger stand-off assembly when in an uninstalled position.

Next, the circuit board 80 and the plunger stand-off assembly 10 secured thereto is positioned adjacent a different electrical component, for example, a computer chassis 90, as shown in FIG. 3. At this point, the outer component 14 is in a raised position due to the inner member 48 engaging the computer chassis 90. It should be noted that the spring 72 is also in a more compressed state when the outer component 14 is in the raised position. To counteract the bias of the spring 72, a force in the opposite direction should be applied to the plunger stand-off assembly 10. Then, the circuit board 80 and the plunger stand-off assembly 10 are moved relative to the computer chassis 90, for example, in the direction of the arrow in FIG. 3, until the inner member 48 of the outer component 14 is aligned with a mounting hole 92 in the computer chassis 90.

Figure 4:
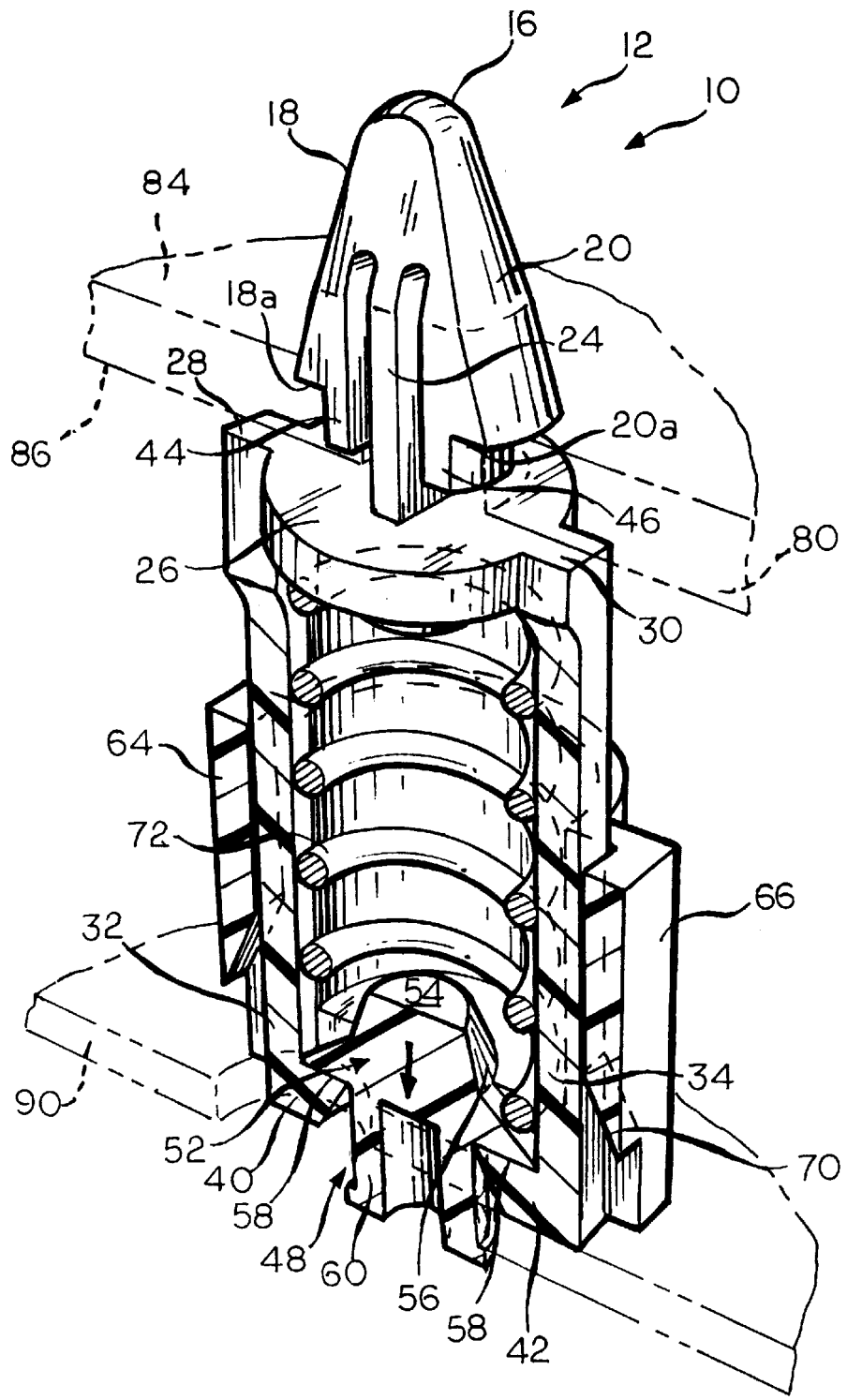
FIG. 4 is a partial cutaway perspective view of the plunger stand-off assembly when in the installed position.

Once the inner member 48 is properly aligned with the mounting hole 92, the bias of the spring 72 causes the inner member 48, along with the outer component 14, to move in the downward direction (as indicated by the arrow in FIG. 4). The inner member 48 and outer component 14 continue to move in the downward direction until the step 58 of the inner member 48 engage the steps 40, 42 of the inner component 12. At this point, the cylindrical lower portion 60 of the outer component 12 is received in the mounting hole 92 of the computer chassis 90, as shown in FIG. 4, thereby securing the circuit board 80 to the computer chassis 90.

As described above, the plunger stand-off assembly 10 securely attaches the circuit board 80 to the computer chassis 90 without the need for tools. Further, the plunger stand-off assembly 10 allows the circuit board 80 to be securely attached to the computer chassis 90 without having to power down the computer. Thus, the plunger stand-off assembly 10 of the invention provides a fast, cost-effective method of securing electrical components as compared to conventional methods.

In accordance with the provisions of the patent statutes, the principle and mode of operation of this invention have been explained and illustrated in its preferred embodiment. However, it must be understood that this invention may be practiced otherwise than as specifically explained and illustrated without departing from its spirit or scope.

What is claimed is:

1. A plunger stand-off assembly for connecting a circuit board to a chassis, comprising:
   an inner component,
   an outer component including an inner member and outer member, the inner member disposed within said inner component and an outer member disposed around said inner component, and
   a spring biasing said inner and outer components for causing relative movement therebetween.

2. The assembly according to claim 1, wherein said inner component includes cone-shaped portion having at least one angled outer surface, a central portion connected to the cone-shaped portion by a central rib, and a pair of shoulders extending outwardly from the central portion.

3. The assembly according to claim 2, wherein said inner component further includes a pair of legs extending downwardly from the pair of extending shoulders, and a step at one end of each leg.

4. The assembly according to claim 3, wherein the central portion includes a step portion forming a recess between the step portion and the pair of legs.

5. The assembly according to claim 2, wherein the cone-shaped portion further includes a plurality of ribs for allowing the at least one angled outer surface to flex inwardly toward the central rib when force is applied to the angled outer surface.

6. The assembly according to claim 2, wherein the cone-shaped portion includes a lower surface forming a step.

7. The assembly according to claim 1, wherein said inner member includes an upper portion, and a substantially cylindrical lower portion.

8. The assembly according to claim 7, wherein the upper portion includes a head and a tapered outer surface terminating in a lower surface forming a step.

9. The assembly according to claim 1, wherein said outer member includes a middle section and a pair of downwardly projecting end portions.

10. A plunger stand-off assembly for connecting a circuit board to a chassis, comprising:

an inner component including a cone-shaped portion having at least one angled outer surface, a central portion connected to the cone-shaped portion by a central rib, a pair of shoulders extending outwardly from the central portion, a pair of legs extending downwardly from the pair of extending shoulders, and a step at one end of each leg, an outer component capable of relative movement with said inner component, and a spring biasing said inner and outer components for causing relative movement therebetween.

11. The assembly according to claim 10, wherein the central portion includes a step portion forming a recess between the step portion and the pair of legs.

12. The assembly according to claim 10, wherein the cone-shaped portion further includes a plurality of ribs for allowing the at least one angled outer surface to flex inwardly toward the central rib when force is applied to the angled outer surface.

13. The assembly according to claim 10, wherein the cone-shaped portion includes a lower surface forming a step.

14. The assembly according to claim 10, wherein said outer component includes an inner member and outer member, the inner member disposed within said inner component and an outer member disposed around said inner component.

15. The assembly according to claim 14, wherein said inner member includes an upper portion, and a substantially cylindrical lower portion.

16. The assembly according to claim 15, wherein the upper portion includes a head and a tapered outer surface terminating in a lower surface forming a step.

17. The assembly according to claim 14, wherein said outer member includes a middle section and a pair of downwardly projecting end portions.

* * * * *